(12) United States Patent
Weller

(10) Patent No.: US 7,600,169 B2
(45) Date of Patent: Oct. 6, 2009

(54) SYSTEMS AND METHODS OF TEST CASE GENERATION WITH FEEDBACK

(75) Inventor: Christopher Todd Weller, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 805 days.

(21) Appl. No.: 10/987,025

(22) Filed: Nov. 12, 2004

(65) Prior Publication Data

US 2006/0117237 A1 Jun. 1, 2006

(51) Int. Cl.
*G06F 11/00* (2006.01)
(52) U.S. Cl. .................. 714/738; 714/741; 714/739; 703/13; 703/14; 703/15
(58) Field of Classification Search .............. 714/733, 714/738–741; 703/13–22
See application file for complete search history.

(56) References Cited

U.S. PATENT DOCUMENTS

| 5,202,889 | A | | 4/1993 | Aharon et al. |
| 5,729,554 | A | | 3/1998 | Weir et al. |
| 5,771,241 | A | | 6/1998 | Brummel |
| 6,110,218 | A | * | 8/2000 | Jennings ...................... 703/22 |
| 2002/0156608 | A1 | * | 10/2002 | Armbruster et al. ........... 703/14 |
| 2006/0070035 | A1 | * | 3/2006 | Ulrich et al. ................ 717/124 |

* cited by examiner

*Primary Examiner*—Guy J Lamarre

(57) ABSTRACT

Systems and methods for implementing test case generation with feedback are disclosed. An exemplary system for test case generation with feedback comprises a plurality of knobs identifying test values for a device under test. A plurality of buckets is each associated with at least one of the test values, each bucket having a weight value for the associated test value. A failure analysis module is operatively associated with the device under test, the failure analysis module changing at least some weight values based on feedback from test operations for the device under test. A test case generator selects test values for test operations based on the weight value for the associated test value.

12 Claims, 5 Drawing Sheets

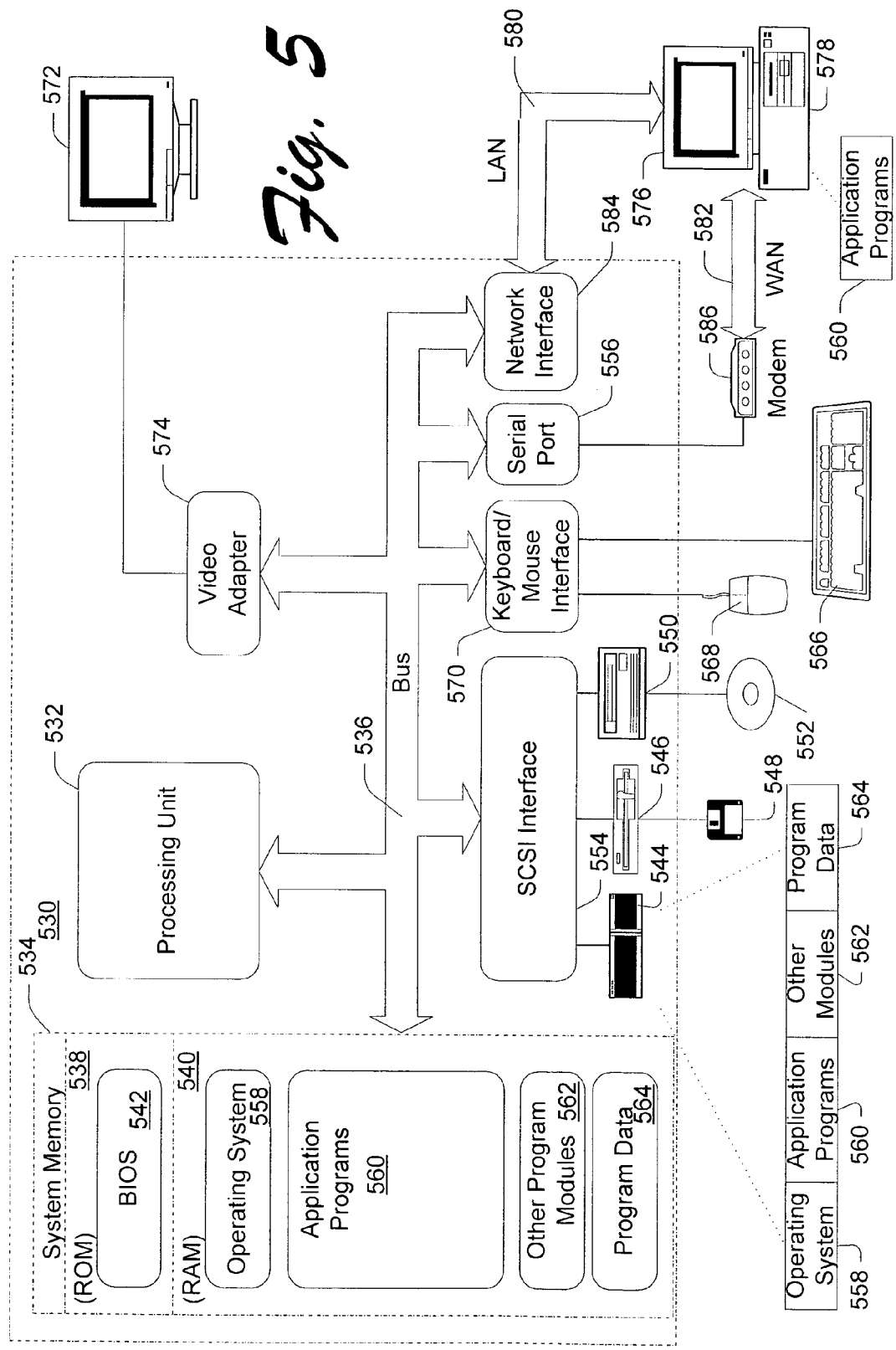

SYSTEMS AND METHODS OF TEST CASE GENERATION WITH FEEDBACK

TECHNICAL FIELD

The described subject matter relates to test case generation, and more particularly to systems and methods of test case generation with feedback.

BACKGROUND

Random code generators are used extensively to test operation of computing systems, integrated circuits, etc. (generally referred to as the "device under test"). Random code generators typically generate test cases including instructions (e.g., mathematical operations and read/write operations) and data patterns for exercising various components (e.g., I/O registers and memory) of the device under test to identify problems. For example, a failure which occurs frequently during execution of floating point instructions may indicate a problem with the floating point circuitry.

Test cases may be generated based on various test parameters (or "knobs") and settings for each knob. In order to cover a large number of test parameters (or "knob space"), random code generators typically randomize the knob settings between testing. However, a pure random approach increases test time and may not focus on components which result in the most failures.

Alternatively, test results may be manually inspected and test parameters added or removed from use in future test cases to increase the likelihood that the testing continues to focus on failures in the device under test. However, manual inspection is labor intensive, increasing the time to market and cost of the final product. In addition, the manual adjustments may inadvertently focus the test cases on minor problems while downplaying or altogether ignoring potentially more significant problems with the device under test.

SUMMARY

Test case generation may be implemented as a system. An exemplary system may comprise a plurality of knobs identifying test values for a device under test. A plurality of buckets each associated with at least one of the test values, each bucket having a weight value for the associated test value. A failure analysis module operatively associated with the device under test, the failure analysis module changing at least some weight values based on feedback from test operations for the device under test. A test case generator selecting test values for test operations based on the weight value for the associated test value.

In another exemplary embodiment, test case generation with feedback may be implemented as a method, comprising: associating weight values with each of a plurality of knob settings for a device under test, changing at least one of the weight values based on test operations for the device under test, and selecting knob settings for test operations based on the current weight values of each knob setting.

Another exemplary embodiment of test case generation with feedback may be implemented in a computer program product encoding a computer program for executing a computer process. The computer process may comprise: weighting each of a plurality of knob settings for a device under test, changing the weighting based on test operations for the device under test, and selecting test values for test operations based on the current weighting for the device under test.

BRIEF DESCRIPTION OF THE DRAWINGS

FIG. 5 is a schematic illustration of an exemplary computing device that can be utilized to implement test case generation with feedback.

DETAILED DESCRIPTION

Briefly, systems and methods of test case generation with feedback described herein may be implemented to increase the speed, efficiency, and ease of hardware verification and characterization of failures. Exemplary embodiments analyze the frequency of failures over time to automatically adjust knob distributions. Accordingly, simpler and/or shorter test cases may be developed based on the knob distributions to analyze and debug failures faster and in more detail.

It is noted that operations described herein may be embodied as logic instructions on a computer-readable medium. When executed on a processor, the logic instructions cause a general purpose computing device to be programmed as a special-purpose machine that implements the described operations.

Exemplary System

Figure 1:
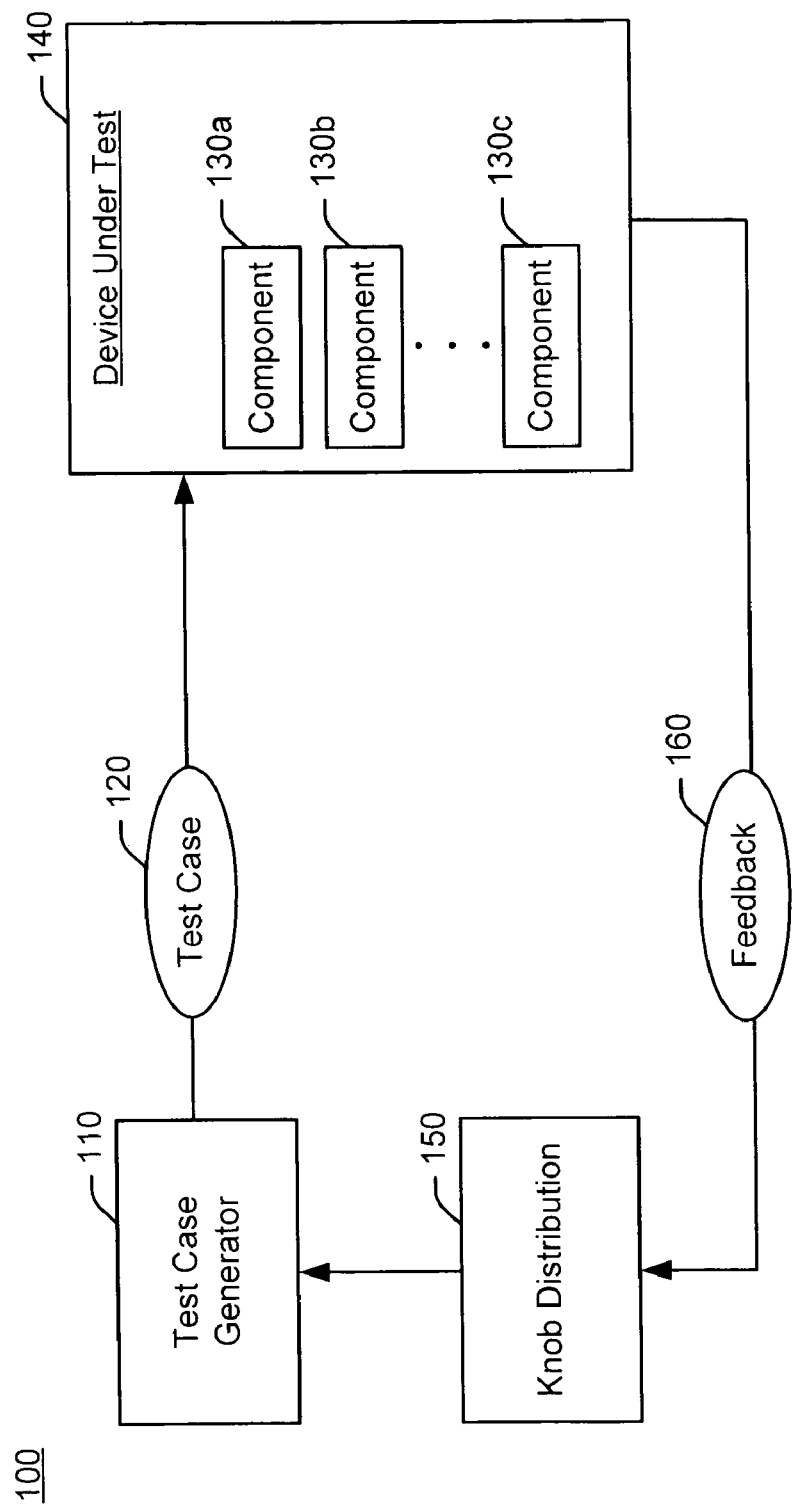
FIG. 1 is a high level illustration of an exemplary system for implementing test case generation with feedback.

FIG. 1 is a high level illustration of an exemplary test system 100. Test system 100 may include a test case generator 110 such as, e.g., a random code generator. Test case generator 110 may be implemented as program code to generate test cases 120 to exercise one or more components 130*a-c* (e.g., I/O registers and memory) of a device under test (DUT) 140.

Before continuing, it is noted that test system 100 is not limited to use with any particular type of DUT 140. DUT 140 may include any of a wide range of device types, such as, but not limited to microprocessors, computing systems, integrated circuits, application specific integrated circuits (ASICs), and logic circuits. It is also noted that test system 100 may be implemented with actual device hardware and/or a model of the device hardware using readily available computer simulation software.

Test cases 120 may include instructions (e.g., mathematical operations and read/write operations) and data patterns for exercising various components 130*a-c* to identify failures and assist in debugging the DUT 140. Test cases 120 may be generated based on any of a wide variety of different test parameters (or "knobs") and test values (or "knob settings") for each knob. For example, knobs may include the balance of instructions or transactions for a test case, the components to be exercised during execution of a test case, and the data patterns provided to the different components 130*a-c* during execution of a test case 120.

In an exemplary embodiment, test case generator 110 generates test cases 120 based on a knob distribution 150. The knob distribution 150 is weighted to influence the selection of knob settings for developing test cases 120. During operation, test case generator 110 receives feedback 160 (e.g., results of executing test cases 120 at the DUT 140). Feedback 160 may be used to change the weights for knob distribution 150 and used to generate additional test cases 120 for further testing of the DUT 140, as described in more detail below.

Figure 2:
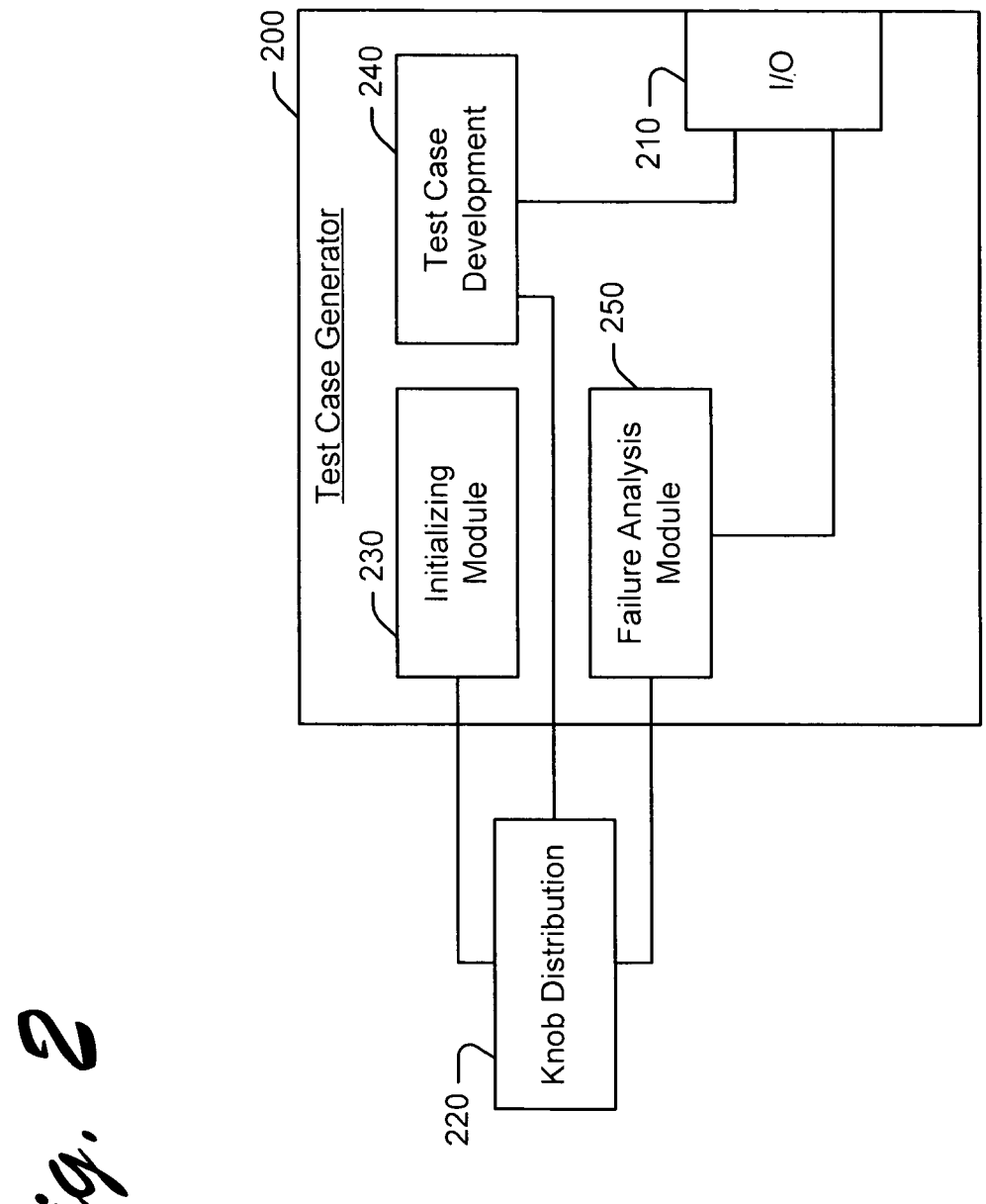
FIG. 2 is a schematic illustration of an exemplary test case generator.

FIG. 2 is a schematic illustration of an exemplary test case generator 200. Test case generator 200 may be communicatively coupled to a device under test (such as the DUT 140 in FIG. 1) to issue test cases and receive feedback, e.g., via input/output (I/O) register 210. Test case generator 200 may also be operatively associated with a knob distribution 220.

An exemplary knob distribution 220 is described in more detail below with reference to FIG. 3. For now it is sufficient to understand that the knob distribution 220 may include knobs and knob settings for each knob. The knob settings may be weighted. Higher weighted knob settings may be selected more frequently by the test case generator 200 for developing test cases. Likewise, lower weighted knob settings may be selected less frequently by the test case generator 200 for developing test cases. The weights may be adjusted based on feedback from the device under test, e.g., to increase the weight of knob settings which resulted in failures during execution of the test cases and focus on these failures during further testing.

Test case generator 200 may be implemented as program code (e.g., software) including logic instructions executable to generate test cases based on feedback from the device under test. The logic instructions may be encoded as functional modules. Exemplary functional modules may include, e.g., initializing module 230, test case development module 240, and failure analysis module 250.

Initializing module 230 may be implemented to initialize the knob distribution 220. Initializing the knob distribution 220 may include identifying knobs and knob settings for the device under test. This process may be facilitated by user input or a data file (e.g., provided by the designer) for the device under test. In addition, the knob distribution may be initialized to provide initial weights for each of the knob settings.

Test case development module 240 may be implemented to generate the test cases. Test case development module 240 may select knob settings for developing the test cases based on the knob distribution 220. As mentioned briefly above, higher weighted knob settings may be selected more frequently and lower weighted knob settings may be selected less frequently. Accordingly, the test cases focus on components of the device under test which may be causing failures.

Failure analysis module 250 may be implemented to analyze feedback from execution of the test cases at the device under test. Failure analysis module 250 may in turn update the knob distribution 220 based on the feedback. For example, the failure analysis module 250 may adjust the weight of knob setting(s) that resulted in a failure.

It is noted that exemplary test case generator 200 is shown and described herein for purposes of illustration and is not intended to be limiting. For example, initializing module 230, test case development module 240, and failure analysis module 250 do not need to be encapsulated as separate functional components. In addition, other functional components may also be provided and are not limited to those shown and described herein.

Figure 3:
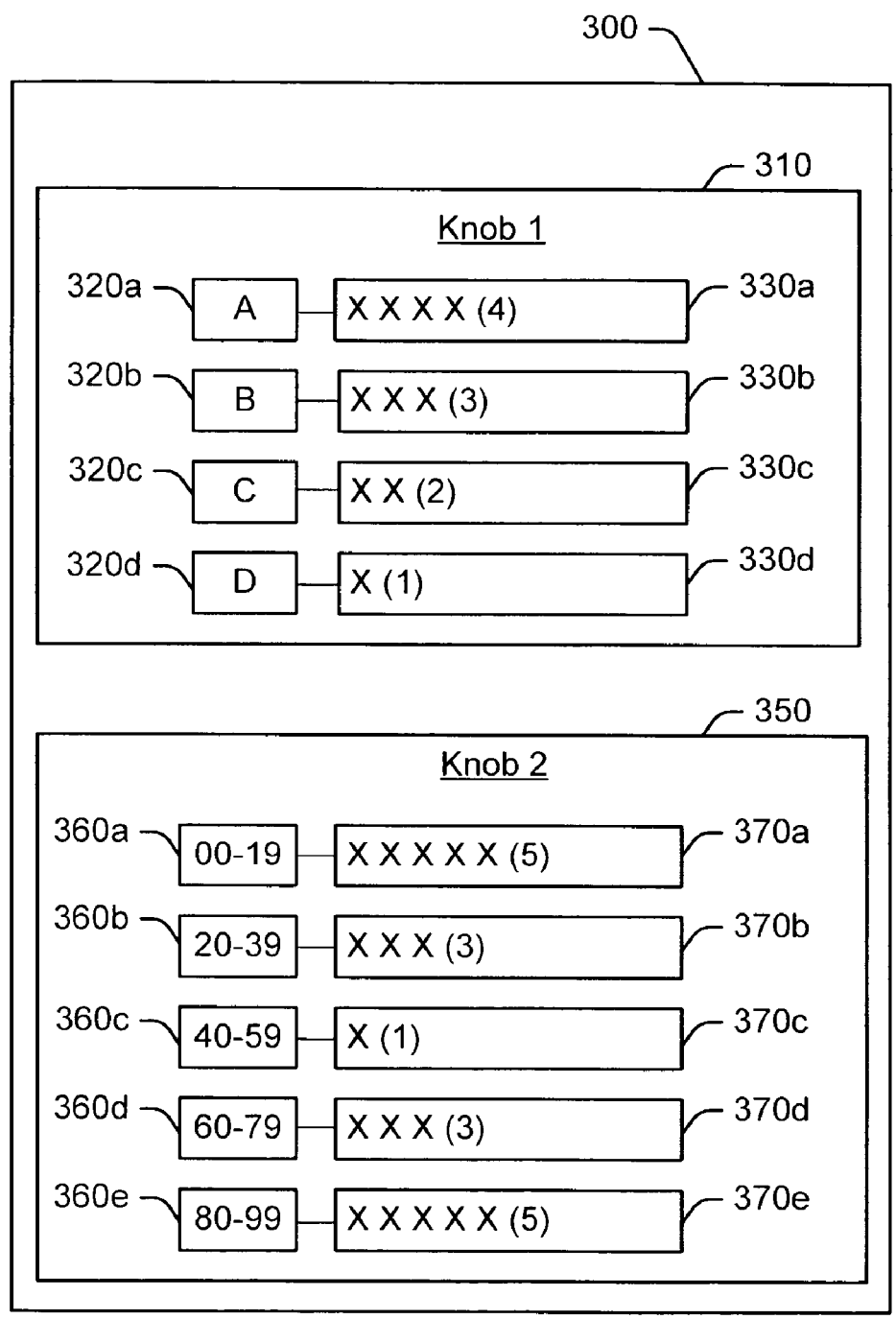
FIG. 3 illustrates an exemplary knob distribution.

FIG. 3 illustrates an exemplary knob distribution 300. Knob distribution 300 may be implemented, e.g., as a data structure including a number of data fields. The data fields may include one or more knobs 310 and 350, knob settings 320a-d and 360a-e for each knob, and buckets 330a-d and 370a-e for weighting each knob setting. Weight values in each bucket are shown in parenthesis ( ) in FIG. 3. It is noted that although integer weight values are used for purposes of illustration herein, the weight values do not need to be integer values.

In an exemplary embodiment, knobs may select from among discrete test values. For purposes of illustration, knob 310 may select from among discrete (generic) values A-D. Buckets 330a-d may be associated with each of the knob settings 320a-d to weight the discrete test values A-D and influence selection during test case generation. For example, the combined weight of all buckets 330a-d is 10. Accordingly, during test case generation test value A has a likelihood of being selected for 4 out of every 10 test cases, test value B has a likelihood of being selected for 3 out of every 10 test cases, and so forth.

In another exemplary embodiment, knobs may select from among ranges of test values. For purposes of illustration, knob 350 may select from among test values in the range 00-99. In order to assign weights to test values in the range, the test values may be divided into subranges (e.g., 00-19, 20-39, etc.). Although each of the subranges shown in FIG. 3 includes the same number of test values, the subranges do not need to be defined in any given manner.

Buckets 370a-e may be associated with each of the knob settings 360a-e to weight the subranges and influence selection of test values for test cases. For example, the combined weight of all buckets 370a-e is 17. Accordingly, during test case generation test values in subranges 0-19 and 80-99 each have a likelihood of being selected for 5 out of every 17 test cases, test values in subranges 20-39 and 60-79 each have a likelihood of being selected for 3 out of every 17 test cases, and so forth.

If a subrange is selected, discrete test values may then be selected from the subrange, e.g., with equal probability. Each test value in the subrange has a likelihood of being selected for 1 of every 20 test cases relative to other values in the same bucket. Overall, however, the likelihood of selecting a test value is increased by weighting the knob settings. For example, subrange 00-19 (knob setting 360a) has a likelihood of being selected for 5 out of every 17 test cases, and the test value 12 has a likelihood of being selected from the subrange 00-19 for one out of every 20 test cases. Therefore, test value 12 has an overall likelihood of being selected for one out of every 68 test cases ($5/17 * 1/20 = 1/68$).

Before continuing, it is noted that discrete values within the selected subrange do not need to be selected with equal probability. For example, in another embodiment a ramping distribution may be used to create a piecewise-linear distribution across the entire range for the knob. Still other embodiments are also contemplated as will be readily apparent to those having ordinary skill in the art after having become familiar with the subject matter described herein.

As discussed briefly above, knob distribution 300 may be changed based on feedback resulting from executing test cases at the device under test. In an exemplary embodiment, the knob settings may be analyzed (e.g., by the failure analysis module 250 in FIG. 2) to determine which test parameters resulted in failure(s). The bucket weights may be changed for knob settings resulting in a failure to increase the likelihood of selecting these knob settings for developing test cases and thereby increase the likelihood of another failure during future testing.

Changing the knob distribution 300 may be illustrated as follows. At time t0 each bucket may be assigned an initial weight of 10, as shown in Table 1. Again, the total weight for each bucket is shown in parenthesis ( ).

TABLE 1

Exemplary Initial Distribution at Time ($t_0$)

| Knob | Knob Setting | Bucket Weight |
|---|---|---|
| Knob 1 | Option A | X X X ... (10) |
| | Option B | X X X ... (10) |
| | Option C | X X X ... (10) |
| | Option D | X X X ... (10) |
| Knob 2 | 00-19 | X X X ... (10) |
| | 20-39 | X X X ... (10) |
| | 40-59 | X X X ... (10) |
| | 60-79 | X X X ... (10) |
| | 80-99 | X X X ... (10) |

Test cases that are generated using the knob distribution 300 of Table 1 have an equal likelihood of including each of the knob settings. That is, each knob setting has a $10/40$ (or 25%) likelihood of being selected for a test case.

Following execution of one or more test cases (at time $t_1$), feedback from the device under test may indicate the occurrence of one or more failures. For example, if execution of a test case having knob settings (A, 67) fails, weights for these knob settings may be changed (e.g., incremented by a weight value of 1 in this example). The modified knob distribution 300 is shown in Table 2.

TABLE 2

Exemplary Distribution at Time ($t_1$)

| Knob | Knob Setting | Bucket Weight |
|---|---|---|
| Knob 1 | Option A | X X X X ... (11) |
| | Option B | X X X ... (10) |
| | Option C | X X X ... (10) |
| | Option D | X X X ... (10) |
| Knob 2 | 00-19 | X X X ... (10) |
| | 20-39 | X X X X ... (11) |
| | 40-59 | X X X ... (10) |
| | 60-79 | X X X ... (10) |
| | 80-99 | X X X ... (10) |

Test cases that are generated using the modified knob distribution 300 shown in Table 2 have a higher likelihood of including knob settings A and a value in the subrange 60-7. That is, each of these knob settings now have an $11/41$ (or 26.83%) likelihood of being selected for a test case.

After continuing testing (over time $t_n$), the knob distribution 300 may be modified as shown in Table 3.

TABLE 3

Exemplary Distribution at Time ($t_n$)

| Knob | Bucket | Weight |
|---|---|---|
| Knob 1 | Option A | X X X X X X X X X X X ... (32) |
| | Option B | X X X X X ... (13) |
| | Option C | X X X ... (10) |
| | Option D | X X X X ... (11) |
| Knob 2 | 00-19 | X X X X X X X ... (19) |
| | 20-39 | X X X ... (11) |
| | 40-59 | X X X ... (12) |
| | 60-79 | X X X X X X X X ... (24) |
| | 80-99 | X X X ... (10) |

Analysis of the knob distribution 300 shown in Table 3 indicates that Knob 1: Knob Setting A, and Knob 2: Knob Settings 0-19 and 60-79 result in failures more frequently than the other knob settings. Accordingly, the distribution data may be used to identify components and characterize failures for debugging the device under test. The distribution data may also be used to identify components which are operating satisfactorily.

Before continuing, it is recognized that increasing the weight of a knob setting increases the likelihood that the particular knob setting will be selected again, and therefore random failures may skew testing. To reduce the occurrence of skew, weighting may be changes by small increments relative to the initial weighting. Alternatively, the weighting may be changed by dynamic increments. Dynamic increments may include, e.g., a percentage of the overall bucket weight. In addition, negative scoring may be implemented wherein the weight may be decreased (e.g., by a fixed value or percentage of the bucket weight) if a test case passes.

It is also recognized that the number of knob settings may also influence testing. Implementing too few knob settings may reduce test precision, while implementing too many buckets may overcomplicate testing. Although selecting knob settings depends at least to some extent on design considerations (e.g., the type of device being tested, the desired results), as a general guideline, knob settings may be grouped together if there is not much difference between a test case generated with either of the knob settings.

It is noted that the exemplary embodiments discussed above are provided for purposes of illustration. Still other embodiments are also contemplated.

Exemplary Operations

Figure 4:
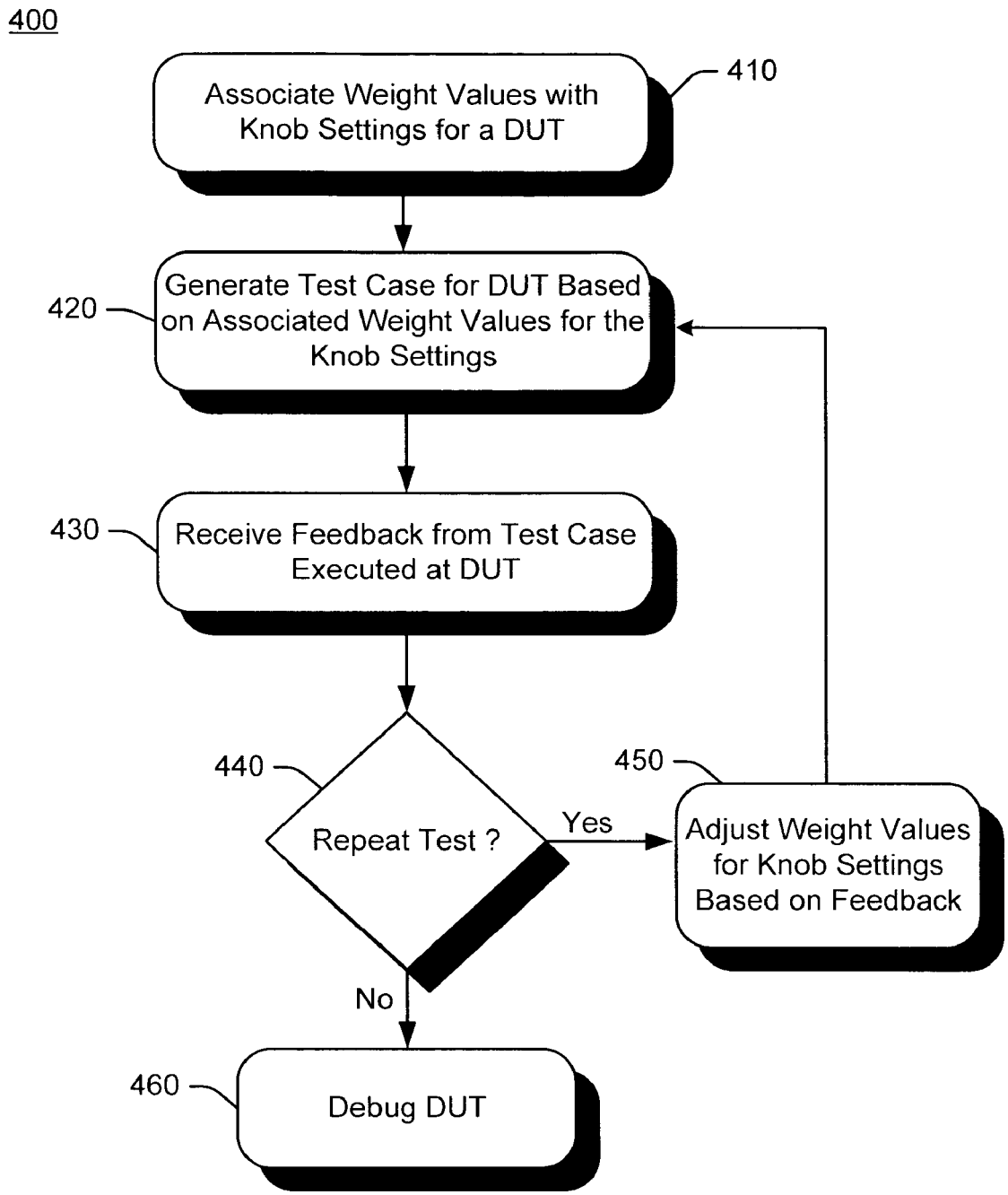
FIG. 4 is a flowchart illustrating exemplary operations to implement test case generation with feedback.

FIG. 4 is a flowchart illustrating exemplary operations 400 to implement test case generation with feedback. Operations 400 may be embodied as logic instructions on one or more computer-readable medium. When executed on a processor, the logic instructions cause a general purpose computing device to be programmed as a special-purpose machine that implements the described operations. In an exemplary embodiment, the components and connections depicted in the figures may be used to implement test case generation with feedback.

In operation 410, weight values are associated with knob settings for a device under test (DUT). For example, all knob settings may be initialized with the same weight values. In an alternate example, suspect knob settings may be initialized with higher weight values. In operation 420, a test case is generated for the DUT based on the weight values associated with the knob settings. In operation 430, feedback is received from execution of the test case at the DUT.

In operation 440, a determination is made whether to repeat testing of the DUT. If testing continues in operation 450, the weight values may be adjusted for the knob settings based on feedback from prior testing. Operations may then return to operation 420 and proceed as discussed above using the modified knob distribution. Alternatively, if testing stops in operation 460, the DUT may be debugged, e.g., based on results from executing the test cases during operations 410-440.

The operations shown and described herein are provided to illustrate exemplary embodiments of test case generation with feedback. It is noted that the operations are not limited to the ordering shown. For example, the weight values may be adjusted (e.g., operation 450) before a determination is made whether to repeat testing of the device under test (e.g., operation 440). Still other operations may also be implemented.

Exemplary Computing Device

FIG. 5 is a schematic illustration of an exemplary computing device that can be utilized to implement test case generation with feedback. Computing device 530 includes one or more processors or processing units 532, a system memory 534, and a bus 536 that couples various system components including the system memory 534 to processors 532. The bus 536 represents one or more of any of several types of bus structures, including a memory bus or memory controller, a peripheral bus, an accelerated graphics port, and a processor or local bus using any of a variety of bus architectures. The system memory 534 includes read only memory (ROM) 538 and random access memory (RAM) 540. A basic input/output system (BIOS) 542, containing the basic routines that help to transfer information between elements within computing device 530, such as during start-up, is stored in ROM 538.

Computing device 530 further includes a hard disk drive 544 for reading from and writing to a hard disk (not shown), and may include a magnetic disk drive 546 for reading from and writing to a removable magnetic disk 548, and an optical disk drive 550 for reading from or writing to a removable optical disk 552 such as a CD ROM or other optical media. The hard disk drive 544, magnetic disk drive 546, and optical disk drive 550 are connected to the bus 536 by a SCSI interface 554 or some other appropriate interface. The drives and their associated computer-readable media provide nonvolatile storage of computer-readable instructions, data structures, program modules and other data for computing device 530. Although the exemplary environment described herein employs a hard disk, a removable magnetic disk 548 and a removable optical disk 552, other types of computer-readable media such as magnetic cassettes, flash memory cards, digital video disks, random access memories (RAMs), read only memories (ROMs), and the like, may also be used in the exemplary operating environment.

A number of program modules may be stored on the hard disk 544, magnetic disk 548, optical disk 552, ROM 538, or RAM 540, including an operating system 558, one or more application programs 560, other program modules 562, and program data 564. A user may enter commands and information into computing device 530 through input devices such as a keyboard 566 and a pointing device 568. Other input devices (not shown) may include a microphone, joystick, game pad, satellite dish, scanner, or the like. These and other input devices are connected to the processing unit 532 through an interface 570 that is coupled to the bus 536. A monitor 572 or other type of display device is also connected to the bus 536 via an interface, such as a video adapter 574.

Computing device 530 may operate in a networked environment using logical connections to one or more remote computers, such as a remote computer 576. The remote computer 576 may be a personal computer, a server, a router, a network PC, a peer device or other common network node, and typically includes many or all of the elements described above relative to computing device 530, although only a memory storage device 578 has been illustrated in FIG. 5. The logical connections depicted include a LAN 580 and a WAN 582.

When used in a LAN networking environment, computing device 530 is connected to the local network 580 through a network interface or adapter 584. When used in a WAN networking environment, computing device 530 typically includes a modem 586 or other means for establishing communications over the wide area network 582, such as the Internet. The modem 586, which may be internal or external, is connected to the bus 536 via a serial port interface 556. In a networked environment, program modules depicted relative to the computing device 530, or portions thereof, may be stored in the remote memory storage device. It will be appreciated that the network connections shown are exemplary and other means of establishing a communications link between the computers may be used.

Generally, the data processors of computing device 530 are programmed by means of instructions stored at different times in the various computer-readable storage media of the computer. Programs and operating systems may distributed, for example, on floppy disks, CD-ROMs, or electronically, and are installed or loaded into the secondary memory of a computer. At execution, the programs are loaded at least partially into the computer's primary electronic memory.

The invention claimed is:

1. A system for test case generation with feedback, comprising:
    a plurality of knobs identifying test values for a device under test;
    a plurality of buckets each associated with at least one of the test values, each bucket having a weight value for the associated test value;
    a failure analysis module operatively associated with the device under test, the failure analysis module changing at least some weight values based on feedback from test operations for the device under test; and
    a test case generator selecting test values based on the weight value for the associated test value, the test values forming the test case for test operations on the device under test.

2. The system of claim 1 wherein each knob includes a plurality of knob settings identifying the test values, and the buckets are each associated with at least one of the knob settings.

3. The system of claim 2 wherein the knob settings are discrete test values.

4. The system of claim 2 wherein the knob settings includes subranges of test values.

5. The system of claim 1 wherein the failure analysis module increases the weight value if the associated test value fails during test operations.

6. The system of claim 1 wherein the failure analysis module decreases the weight value if the associated test value passes during test operations.

7. The system of claim 1 wherein the failure analysis module increases the weight value for a test value if the test value fails during test operations.

8. The system of claim 1 wherein the failure analysis module changes at least some weight values by fixed increments.

9. The system of claim 1 wherein the failure analysis module changes at least some weight values by dynamic increments.

10. A computer program product encoding a computer program for executing a computer process for test case generation with feedback, the computer process comprising:
    weighting each of a plurality of knob settings for a device under test;
    changing the weighting based on test operations for the device under test; and
    selecting test values for test operations on the device under test based on the current weighting for the device under test.

11. The computer program product of claim 10 wherein the computer process further comprises increasing the weighting when the knob settings fail during testing of the device under test.

12. The computer program product of claim 10 wherein the computer process further comprises decreasing the weighting when the knob settings fail during testing of the device under test.

* * * * *